United States Patent [19]

Mortensen

[11] Patent Number: 5,317,207
[45] Date of Patent: May 31, 1994

[54] INTEGRATED CIRCUIT HAVING REDUCED ELECTROMAGNETIC EMISSIONS AN INTEGRATED CIRCUIT INCLUDING A VARIABLE IMPEDANCE FOR REDUCED ELECTROMAGNETIC EMISSION

[75] Inventor: Gordon L. Mortensen, San Jose, Calif.

[73] Assignee: National Semiconductor Corporation, Santa Clara, Calif.

[21] Appl. No.: 56,807

[22] Filed: May 3, 1993

Related U.S. Application Data

[63] Continuation of Ser. No. 765,847, Sep. 26, 1991, abandoned.

[51] Int. Cl.⁵ .......................................... H03K 17/16
[52] U.S. Cl. .................................... 307/443; 307/452; 307/296.1; 307/296.6; 307/263
[58] Field of Search ............... 307/443, 452, 482, 481, 307/296.1, 296.6, 263

[56] References Cited

U.S. PATENT DOCUMENTS

| | | | |
|---|---|---|---|
| 4,959,562 | 3/1992 | Fukunaga | 307/443 |
| 4,999,519 | 3/1991 | Kitsukawa et al. | 307/446 |
| 5,099,138 | 9/1990 | Ootani | 307/443 |

OTHER PUBLICATIONS

Mardiguian, M., "Electromagnetic Control in Components and Devices-A Handbook Series on Electromagnetic Interference and Compatibility", Interference Control Technologies, Inc. Gainesville, VA, vol. 5 at pp. 2.36, 6.12 and 9.4–9.21 (1988).

*Primary Examiner*—Robert J. Pascal
*Assistant Examiner*—Reginald A. Ratliff
*Attorney, Agent, or Firm*—Townsend and Townsend Khourie and Crew

[57] ABSTRACT

A circuit is provided that reduces the electromagnetic emissions from an integrated circuit. The circuit includes the resistive portion of an intrinsic low pass filter network and a means for modulating the resistance in response to switching of the integrated circuit nucleus logic elements. The resistance is increased before the nucleus logic elements switch and is gradually decreased upon completion of all switching of the nucleus logic elements. A portion of the transient switching pulse waveform, normally provided by the external power supply, is instead provided by the intrinsic nucleus capacitance associated with the nucleus logic. In particular the high frequency components are sourced by the intrinsic nucleus capacitance. The amplitude and the rise time of the transient switching pulse is thereby reduced. Further reduction in electromagnetic emission is provided by modified output buffers where transient switching waveforms are reduced by current limiting the output switching transistors and providing initial transient current from the intrinsic capacitance associated with the output buffer.

23 Claims, 7 Drawing Sheets

INTEGRATED CIRCUIT HAVING REDUCED ELECTROMAGNETIC EMISSIONS AN INTEGRATED CIRCUIT INCLUDING A VARIABLE IMPEDANCE FOR REDUCED ELECTROMAGNETIC EMISSION

This is a continuation of application Ser. No. 07/765,847, filed Sep. 26, 1991, now abandoned.

BACKGROUND OF THE INVENTION

This invention generally relates to semiconductor integrated circuits and more particularly to CMOS integrated circuits having circuit means for reducing electromagnetic emissions.

In modern electronic systems, which often include many integrated circuits, the rapid switching of many thousands of logic elements causes electromagnetic emissions. Such emissions, when transmitted along power buss conductors, can interfere with the operation of the electronic system. Electromagnetic emissions may also interfere with the operation of nearby electrical equipment due to electromagnetic fields radiated into space.

Electromagnetic fields are a combination of alternating electric and magnetic fields. The electric lines of force are perpendicular to the magnetic lines of force at every point in space. The field propagates in a direction perpendicular to both electric and magnetic lines of force.

The effects of electromagnetic emissions may be as simple as static on the radio or as catastrophic as complete failure of the electronic system. If the electronic system produces excessive emissions, the system may not meet government regulations regarding emissions standards set by, for example, the Federal Communications Commission (FCC).

Prior art electronic systems have attempted to reduce electromagnetic emissions with careful attention to the layout of printed circuit boards. Sometimes additional components, such as RLC filters or chokes, must be added to the power buss or other "noisy" conductors. If the electronic system includes software, such software may be rewritten to spread noise generating circuit activity over a longer time period. In extreme instances, the crystal frequency of the system clock may have to be reduced to increase the amount of time between bursts of electromagnetic emissions.

Additional prior art methods attempt to reduce the effect of electromagnetic emissions by shielding electromagnetic sensitive components with a Faraday cage or locating sensitive components away from the source of the electromagnetic emission.

Using all the above methods to reduce electromagnetic emission problems may be required to overcome susceptibility to such emissions on a single electronic system. However, due to the random nature of such problems, it is typically very difficult, time consuming and expensive to reduce system susceptibility.

Furthermore, as such electronic systems operate at higher frequencies, the generation of electromagnetic emissions may increase rendering the above methods insufficient to reduce system susceptibility and pass FCC regulations. Accordingly, there is a great need to reduce the generation of electromagnetic emissions at the source.

One major source of electromagnetic emissions in a typical modern electronic system is the integrated circuit. Such integrated circuits have large numbers of outputs, each of which switches a relatively large amount of current, and tens of thousands of internal, or nucleus, logic elements. With a high frequency clock signal, such integrated circuits generate high amplitude transient waveforms superimposed on the power supply busses or conductors. These waveforms, which include high amplitude, high frequency fundamentals and harmonics, can be radiated or conducted to other components in the electronic system.

The integrated circuit package can further exacerbate the problems associated with electromagnetic emissions. For example, packages, such as a pin grid array package, can increase conducted and/or radiated electromagnetic emissions because longer bonding wires are required to interconnect the bonding pad on the package to the bonding pad on the integrated circuit. Each of these bonding wires acts as a loop or whip antenna from which electromagnetic emissions are radiated. Bonding wires connecting output buffers of the integrated circuit to bonding pads on the package are major contributors to radiated emissions because of the large amount of current typically switched by an output buffer.

Several methods are typically implemented to reduce package induced electromagnetic emissions. One method uses a discrete capacitor, such as flip-chip capacitor, connected between each noisy conductor and ground. These capacitors, which are often placed within the package cavity, act as a low pass filter but since the resistive component is necessarily low, the filter is relatively inefficient. Another method requires that ferrite beads be placed around the outside of noisy package pins.

Both techniques often reduce electromagnetic emissions but may not provide sufficient reduction for high speed integrated circuits having a significant number of outputs. Further, positioning capacitors within package cavity is a non-trivial task significantly increasing the cost of such packages. Ferrite beads are similarly undesirable because a bead must be used for each pin generating electromagnetic emissions. Because of the cost associated with ferrite beads, their use is usually restricted to the package pins generating the most electromagnetic emissions.

SUMMARY OF THE INVENTION

In accordance with the present invention, an integrated circuit is provided having circuit means for reducing electromagnetic emissions generated by the integrated circuit. Such emissions are typically generated by the large numbers of transistors that switch in response to a transition of an input clock signal. Such simultaneous switching of the transistors generates high amplitude transient pulses that must be provided by an external power supply. It is these transient pulses that cause most of the electromagnetic emissions generated by integrated circuits.

The embodiments of the present invention reduce the generation of electromagnetic emissions by reducing the amplitude of the transient pulses and by spreading pulse energy over an extended period of time. This reduction is made possible by dynamically modulating the resistive portion of a low pass filter between the power supply and the integrated circuit's nucleus logic. The low pass filter includes the intrinsic capacitance associated with the nucleus logic in addition to the modulated resistive element. A pair of delay elements generate a logic clock, delayed relative to the input clock, and a twice-delayed clock signal delayed relative to the logic clock. A control pulse derived from corresonding transistions of the input clock signal and the twice-delayed clock signal. The modulation of the resistive element is in response to the control pulse.

The width of the control pulse is determined by a transition of the input clock and by a corresponding transition of the twice-delayed clock signal. The first transition of the control pulse increases the resistance of integrated circuit's power supply buss as seen by the external power supply. The second transistion gradually decreases the resistance. In this manner, the control pulse brackets each transition of the logic clock and a low pass filter is in series whenever the nucleus logic elements switch from one logic state to another.

With a high impedance in series between the external power supply and the internal nucleus power buss of the integrated circuit, the voltage level on the nucleus power buss is necessarily reduced. The lower power supply voltage may reduce the switching speed of internal logic. However, with a lower voltage on the internal nucleus power buss, the threshold or trip level of the logic elements is correspondingly reduced. With a lower trip level, any reduction in switching speed caused by the reduced voltage on the internal nucleus power buss is minimized. Since the resistive connection to the external power supply chokes the amount of current that may be instantaneously provided to the integrated circuit, transient current and in particular the high frequency component of the current waveform demanded by the nucleus logic is drawn from the intrinsic capacitance associated with the nucleus logic of the integrated circuit rather than the external power supply. Even though resistively coupled, the transient charge provided by the capacitor tends to suppport the voltage level on the nucleus power buss.

After the internal logic switching is completed, the resistive element of the low pass filter is gradually decreased and the integrated circuit operates normally. During normal operation, the intrinsic capacitance of the nucleus logic is recharged and is thus available to provide the transient current on subsequent clock transitions.

In a second embodiment, a control pulse is generated having a duration independent of the logic clock signal. In this embodiment, the control pulse is initiated by a transition on the input clock signal and terminated a selected period of time after such transition. In this embodiment, there is no feedback of internal logic clock signals to terminate the control pulse.

As in the first embodiment, the control pulse selectively modulates the resistive portion of the low pass filter in series between the external power supply and the power supply buss of the integrated circuit. The high frequency components of the transient switching current is provided to the nucleus logic from the intrinsic nucleus capacitance. Low frequency components are also provided by the capacitor and supplemented through the resistor from the power supply. After the transient pulse generated by the switching, the resistive element of the low pass filter is gradually decreased allowing the capacitor to be quickly recharged before the next clock transition.

Modified output buffers that reduce electromagnetic emissions are also provided by the present invention. In the modified output buffers, an "active" resistor is provided in series with the power buss to soften the transient power supply spike generated when switching from one logic state to another. The initial transient switching current is provided by the intrinsic capacitance associated with the components of each individual output buffer.

DETAILED DESCRIPTION

Figure 1:
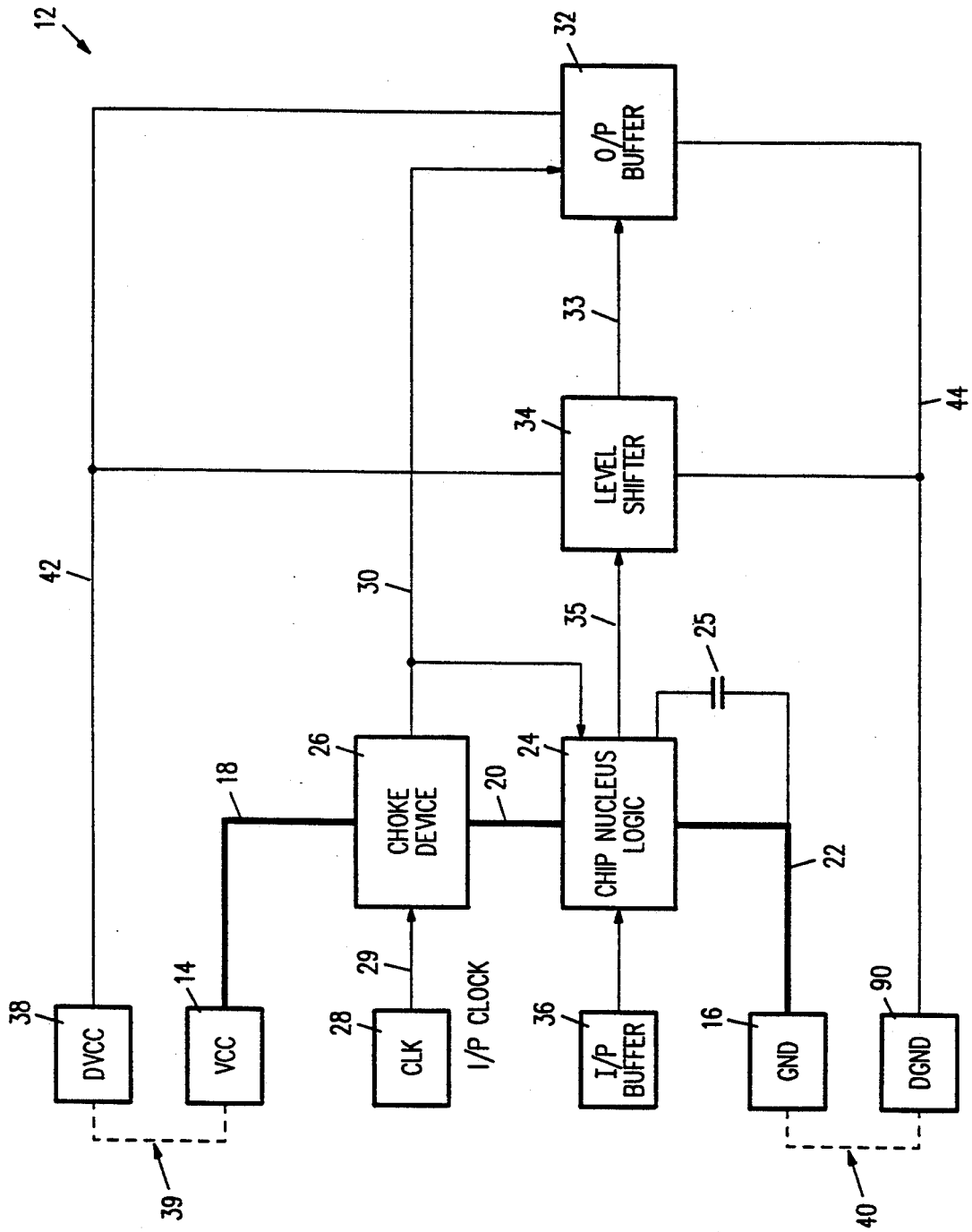
FIG. 1 is a diagrammatic illustration for reducing electromagnetic emissions from an integrated circuit according to the present invention.

The present invention reduces electromagnetic emission by choke limiting the power supply current during each transition of a clock signal and limiting current pulses generated by the switching of output buffers. Referring now to FIG. 1 an integrated circuit 12 is shown having such circuit means for reducing electromagnetic emissions. Integrated circuit 12 receives power from an external power supply (not shown) at Vcc pad 14. Ground reference to integrated circuit 12 is provided at ground pad 16. Power is distributed on Vcc busses 18 and 20 and ground bus 22 to nucleus logic 24. Associated with nucleus logic 24 is a parasitic capacitance 25. Depending on design requirements, the parasitic capacitance 25 could be increased using methods known to one skilled in the art including, but not limited to, configuring spare logic transistors or diodes as capacitors or routing power buss conductors to increase the capacitance. A choke 26 is inserted between Vcc busses 18 and 20. The operation of choke 26 tends to dampen transient current surges from the external power supply by dynamically modulating the resistive portion of a low-pass filter. This filter is coupled between the power supply and nucleus logic 24 in a manner more fully described below in conjunction with FIG. 2.

Clock pad 28 receives an input clock signal from a clock source (not shown) and routes the signal to choke 26. Choke 26 outputs a logic clock on clock buss 30 which is preferably routed to both nucleus logic 24 and to output buffer 32. Data is provided from nucleus logic 24 through a level shifter 34 to output buffer 32 along signal lines 33 and 35. Level shifter 34 ensures error-free transfer of data from nucleus logic 24 to output buffers 32 when choke 26 is in a high impedance state. Level shifter 34 is required because the voltage level on buss 20 will drop as a result of the choking action of choke 26. Further, since output buffers 32 and input buffers 36 are often powered by a separate external power supply commonly referred to as the digital power supply or "DVCC", level shifter 34 compensates for the voltage variations between busses 20 and 42. DVCC power is supplied at pad 38 and a digital ground reference is provided at DGND pad 40. Digital power and ground is distributed to the level shifter 34 and buffers 32 and 36 by power busses 42 and 44. If the actual embodiment does not require a digital power supply, one skilled in the art will understand that pad 38 could be coupled to pad 14 and pad 40 could be coupled to pad 16 as indicated by dashed lines 39 and 41.

In operation, an input clock signal is provided at clock input 28 and routed to choke 26. A logic clock signal is generated by choke 26 and provided to nucleus logic 24 and output buffer 32 on clock bus 30. The clock signal on logic clock buss 30 provides the timing information for internal logic switching. However, switching of the nucleus logic elements generates a large transient current pulse that must be supplied from the external power supply. The amplitude of this large current pulse is directly related to the electromagnetic emissions generated by the typical prior art integrated circuit. Decreasing the rise time and the amplitude of the current pulse generated by such switching provides a significant reduction in electromagnetic emissions.

Figure 2:
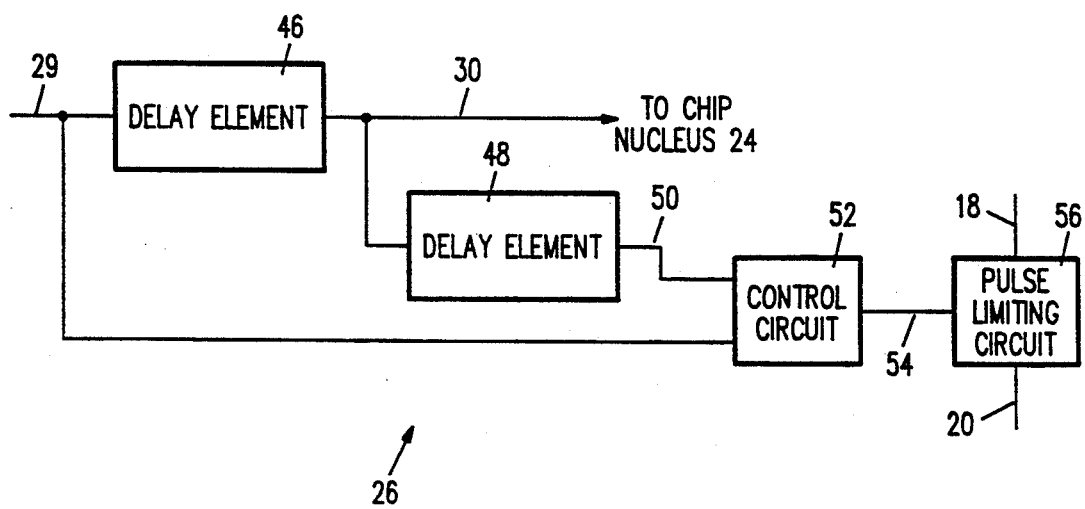
FIG. 2 is a block diagram illustrating one preferred embodiment of the present invention adapted for use with a free-running clock signal.

One preferred embodiment for reducing electromagnetic emissions is shown in FIG. 2. Choke 26 is shown having a first delay element 46, a second delay element 48, control circuit 52 and a pulse limiting circuit 56. Delay element 46 is coupled to clock input 28 by clock buss 29. The signal on clock buss 29 is delayed by delay element 46 and presented to nucleus logic 24 on clock buss 30. Since most logic elements of nucleus logic 24 will switch in response to either a rising or falling transition of the logic clock signal on clock buss 30, transient current pulses generated by such switching will occur substantially coincident with one or the other transition of the logic clock signal. Accordingly, it is desirable to choke buss 18 for a period immediately preceding and following each transition of the logic clock signal.

Because of various delays associated with propagating a clock signal to all logic elements of the integrated circuit 12, it is necessary to maintain the choke on the power supply buss for a period of time sufficient to insure that all or substantially all the switching has occurred. For this reason, the logic clock signal on clock buss 30 is also coupled to a second delay element 48. Delay element 48 generates a delay sufficient to approximate the worst case switching delay associated with nucleus logic 24 and outputs this delayed signal on buss 50. The circuit embodiment shown in FIG. 2 is preferred for integrated circuit 12 where clock 58 (FIG. 3) is free-running.

Buss 50 couples the output of delay element 48 to a control circuit 52. In addition to the signal provided by buss 50, the clock signal on clock buss 29 is also provided to control circuit 52. In response to the clock signal on clock buss 29 and the twice-delayed clock signal on 50, control circuit 52 generates a pulse on line 54 that switches a pulse limiting circuit 56, interconnected between power busses 18 and 20, from a low impedance state into a high impedance state. The operation of choke 26 may be better understood by reference to FIG. 3, where a timing diagram depicting the operation of choke 26 is shown.

Figure 3:
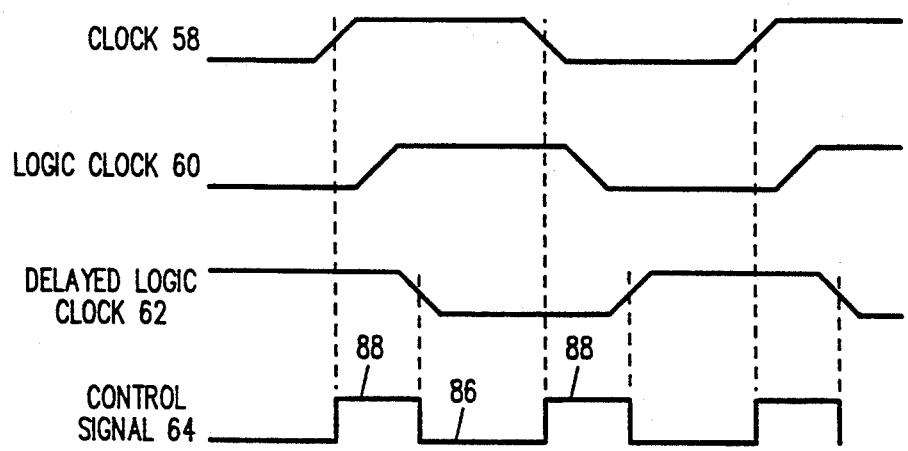
FIG. 3 is a timing diagram illustrating exemplary waveforms associated with the present invention.

Referring to FIGS. 2 and 3, a clock signal 58 is transmitted by clock buss 29 to choke 26. Delay element 46 generates a logic clock 60 on clock buss 30. As shown in FIG. 3, each transition of logic clock 60 is delayed, relative to clock signal 58. This delay time is determined by delay element 46. Logic clock 60 is then presented to the second delay element 48 and to nucleus logic 24. Delay element 48 generates, on buss 50, a delayed logic clock 62 that is delayed relative to logic clock 60 on buss 30.

The time duration between the rising edge of clock signal 58 and a following transition of delayed logic clock 62 generates a control signal 64 which is provided on control line 54. As shown in FIG. 3, the duration of the pulses generated by control circuit 52 are, in the preferred embodiment, of substantially equal duration.

Figure 4:
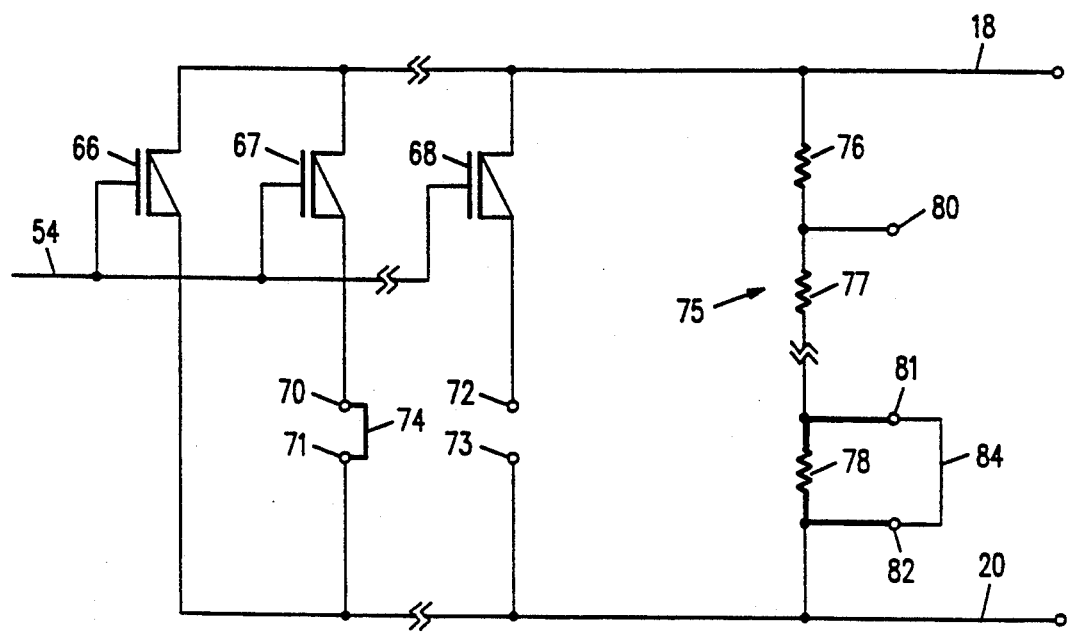
FIG. 4 is a schematic circuit diagram illustrating a preferred circuit means for limiting transient power supply current pulses.

Referring now to FIG. 4, pulse limiting circuit 56 is shown in greater detail. A plurality of transistors 66, 67 and 68 are coupled in parallel between power busses 18 and 20. Since transistors 66–68 will be required to conduct significant amounts of current, it is preferred that these transistors are designed with sufficient channel dimensions to handle the maximum expected current for integrated circuit 12 (FIG. 1). The gate of each transistor 66, 67, and 68 is coupled to control line 54 while each drain is coupled to power buss 18. The source of transistor 66 is preferably coupled directly to power buss 20. However, transistors 67 and 68 are preferably coupled to power buss 20 in a manner that allows pulse limiting circuit 56 to be customized for a particular integrated circuit 12.

For example, in the illustrated embodiment, nodes 70–73 may be selectively jumpered to connect each source of transistors 67–68 to power buss 20. Jumper 74 connects node 70 to node 71 to connect the source of transistor 67 to power buss 20. Since no jumper connects nodes 72 and 73 transistor 68 is effectively disconnected from the circuit. One skilled in the art will understand that jumper 74 could be a metal jumper added during the fabrication process or could comprise a polysilicon fuse that is opened by an externally supplied test signal or by a laser. In this manner, a single macro can be designed and implemented on a variety of integrated circuits 12 and subsequently customized according to the number of logic elements implemented on the integrated device 12.

One skilled in the art will further understand that the dimensions and the number of transistor 66–68 can be replicated in order to provide minimal voltage drop for a given amount of supply current. Accordingly, in other embodiments (not shown) a plurality of transistors in addition to transistors 66–68 may be provided. Obviously, the actual number of transistors 66–68 provided for a given integrated circuit 12 design depends upon the size of transistor 66–68, maximum expected current drawn by integrated circuit 12 and other circuit design parameters.

Connected in parallel with transistors 66–68 is a resistor network 75 comprising resistors 76–78. Resistors 76–78 are selectively switched in series between power busses 18 and 20 in the manner described below. In order to adjust the actual resistance of resistor network 75, taps 80-82 are provided. In this manner, one or more of the resistors can be selectively removed from the ladder by connecting jumper 84 in parallel with the resistor. In the preferred embodiment, jumper 84 is added during the fabrication of a conductive layer such as a first or second metal layer. It is understood that the actual number of resistors provided in resistor network 75 will depend on design criteria, such as maximum supply current, and resistors 76-78 are shown for illustrative purposes only.

Referring again to FIG. 3, the operation of the pulse limiting circuit 56 (FIG. 4) will be discussed in conjunction with the exemplary waveforms shown therein. When control signal 64 on signal line 54 is at a LOW logic level, such as indicated at 86, transistors 66-68 will be biased in the conducting or ON state. Thus, the voltage level on buss 20 will be substantially identical to the voltage level on buss 18. However, when control signal 64 switches to a HIGH logic level, such as indicated at 88, transistors 66-68 will switch into the high impedance or OFF state. Busses 18 and 20 are then substantially coupled by resistor network 75.

With resistor network 75 in series between busses 18 and 20, the external power supply "sees" a low pass filter network. Accordingly, during the switching of the logic elements of nucleus logic 24, initial transient current is provided by the parasitic capacitance associated with nucleus logic denoted as capacitor 25 in FIG. 1 and the additional resistance provided by resistor network 75 removes the high frequency harmonics caused by the transient switching current. In this manner, transient current from the external power supply is reduced in magnitude and harmonic composition and is not correspondingly radiated into space by the power buss thereby reducing electromagnetic emissions.

Figure 5:
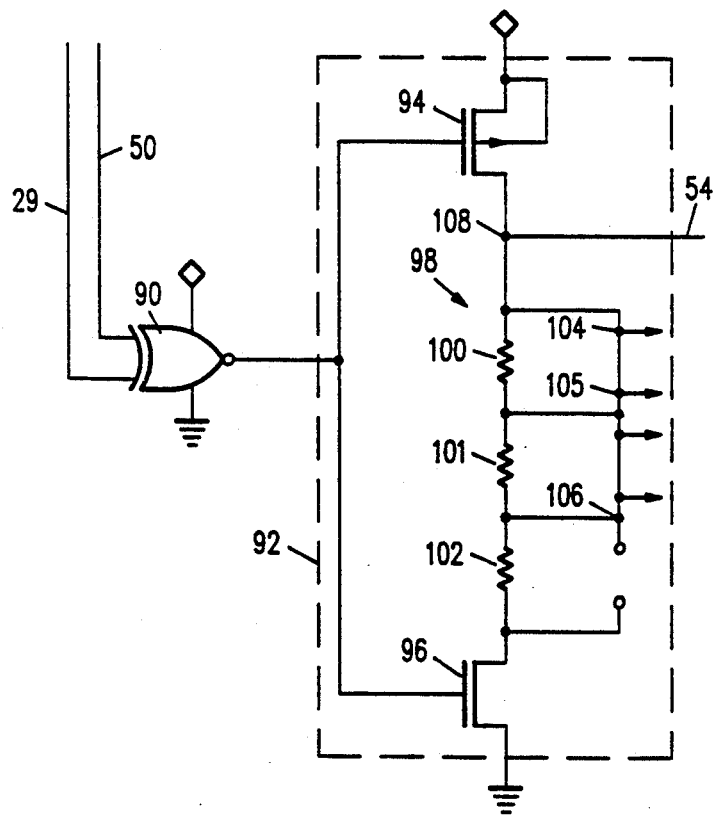
FIG. 5 is a schematic circuit diagram illustrating a preferred embodiment of the pulse control circuit of the present invention.

In one preferred embodiment, shown in FIG. 5, control circuit 52 comprises an exclusive-NOR gate 90 and a gradual turn-off buffer 92 delineated by the dashed line. Gradual turn-off buffer 92 comprises a first and second transistor 94 and 96, respectively and a resistor network 98 that couples the drain of transistor 96 to the source of transistor 94. Resistor network 98 comprises a plurality of resistors 100-102 connected in series. The actual value of the resistor network 98 is determined by disconnecting one or more of the resistors in the network 98 by adding jumpers (not shown) across terminals 104-106. The drain of transistor 94 is connected to power buss 20 and the source of transistor 96 is connected to ground buss 22. The gate of transistors 94 and 96 are coupled to the output of exclusive-NOR gate 90.

By adjusting the resistive value of network 98, the rate of change of the voltage level at node 108 can be adjusted to gradually ramp transistors 66-68 (FIG. 4) from an OFF state (high impedance) to an ON state (low impedance).

The modulation of the resistive element is preformed in the following manner. In operation, a transition of clock signal 58 (FIG. 3) on buss 29 will switch the output of exclusive-NOR gate 90 from its initial HIGH logic level to a LOW logic level. This low level biases transistor 94 into the conducting state pulling node 108 to the high state. With the high on line 54, transistors 66-68 will be in the nonconducting state and are effectively removed from the circuit between busses 18 and 20.

In response to the subsequent transition on clock buss 50, both inputs to exclusive-NOR gate will be the same in which case the output of exclusive-NOR gate 90 will switch from a LOW logic level to a HIGH logic level.

Accordingly, transistor 94 switches into a high impedance state and transistor 96 begins to conduct thereby pulling node 108 and control line 54 to a LOW logic level. However, control line 54 does not instantaneously switch from a HIGH state into a LOW state because of resistor network 98 which tends to slow the HIGH to LOW logic transition on signal line 54. In this manner, transistors 66-68 are gradually switched into the low impedance state thereby gradually bypassing resistor network 75. With resistor network 75 coupled in parallel with transistors 66-68 which are biased in the low impedance state, the low-pass filter is effectively removed from the circuit and busses 18 and 20 reach equilibrium at substantially the same voltage level. During the time interval between transitions on clock signal 58, capacitor 25 (FIG. 1) is recharged so that before the next subsequent transition, sufficient charge will be available to supply the transient current requirements of integrated circuit 12.

Figure 6:
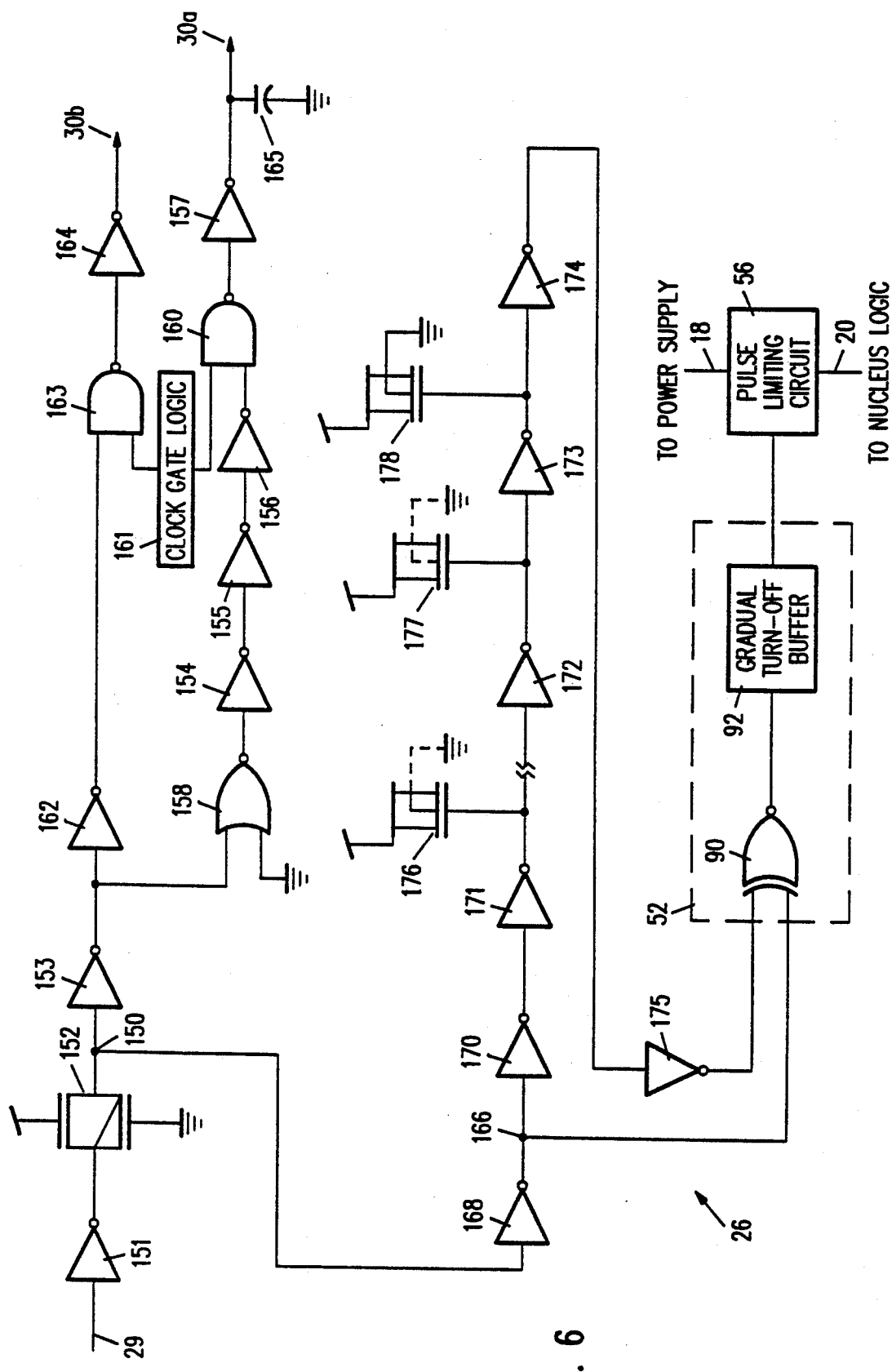
FIG. 6 is a partial circuit schematic, partial block diagram of a second embodiment of the present invention.

Referring now to FIG. 6, an alternative embodiment of choke 26 is shown that may be implemented on integrated circuit 12 where clock signal 58 (FIG. 3) is not free running. In many applications, a plurality of internal clock signals are derived from a single reference clock signal. Each internal clock is usually generated out of phase relative to the other internal clocks so as to ensure proper operation of timing-critical high speed logic paths. Although each transition of the internal clocks causes some portion of nucleus logic 24 to switch, there is no single internal clock from which the falling edge of pulses 88 (FIG. 3) can be generated. Accordingly, in this embodiment pulses 88 are generated independently from the internal clocks.

In the illustrated embodiment shown in FIG. 6, clock buss 29 is coupled to a node 150 by an inverter 152 and transmission gate 153. At node 150, the clock signal provided by clock buss 29 is split into two components. The first component is coupled to a plurality of logic clock busses represented as buss 30a and buss 30b, it being understood that any number of such busses could be provided. Inverters 153-157, exclusive-NOR gate 158 and NAND gate 160 couple the first signal component to buss 30a. The second input to NAND gate 160 is coupled to clock gate logic 161 which selectively inhibits the coupling of the first signal component onto buss 30a. Capacitor 165 represents the intrinsic capacitance associated with the routing of logic clock buss 30a over integrated circuit 12. Inverters 153, 162 and 164 and NAND gate 163 couple the first signal component to buss 30b in a similar manner.

In operation, each pulse of the clock signal appearing at node 150 is selectively coupled to logic clock busses 30a and 30b although each such coupled transition of the pulse is time delayed and possibly phase shifted. For example, the actual amount of time that each pulse is delayed on clock buss 30a depends upon the transmission time through logic elements 153-157 and the inherent capacitance 165.

The second component of the clock signal at node 150 is coupled to node 166 by an inverter 168. At node 166 the signal is again split into two components. The first component is provided directly to an input of exclusive-NOR gate 90. The output of exclusive-NOR gate 90 switches buffer 92 rapidly to the HIGH state thereby inserting the pulse limiting circuit between power buss 18 and power buss 20. The time that it takes to propagate each transistion of clock signal 58 to control circuit 52 is designed to be faster than for the transmission of the same signal to any of the plurality of internal clock busses 30a or 30b. Thus, pulse limiting circuit 56 is always in the high impedance state before the logic begins to switch.

The second component of the signal at node 166 is provided to a series connection of inverters 170-174. It is to be understood that the actual number of inverters connected in series between node 166 and the output of inverter 174 will depend on the expected delay associated with the switching of the logic elements represented by nucleus logic 24. In order to increase the delay associated with each inverter 171-174, capacitors 176-178 are preferably coupled to the output of inverters 171-173, respectively. Capacitors 176-178 slow the transition rate of the outputs of inverters 171-173 in a manner known in the art.

The signal at node 166 is thus replicated at the output of inverter 174 although delayed by a time period that is dependent upon the number of inverters and capacitors coupled in series between node 166 and the output of inverter 174. This signal at the output of inverter 174 is coupled to a second input of exclusive-NOR gate 90 through an inverter 175 to ensure proper biasing of exclusive-NOR gate 90. The second transition appearing at exclusive-NOR gate 90 causes exclusive-NOR gate 90 to switch buffer 92 into the LOW logic level. However, since the transition of buffer 92 from a HIGH level to a LOW level is gradual, the output of buffer 92 slowly transitions from a HIGH state to a LOW state decreasing, in a gradual manner, the resistance between power busses 18 and 20 that was switched in by the first transition of node 166.

Figure 7A:
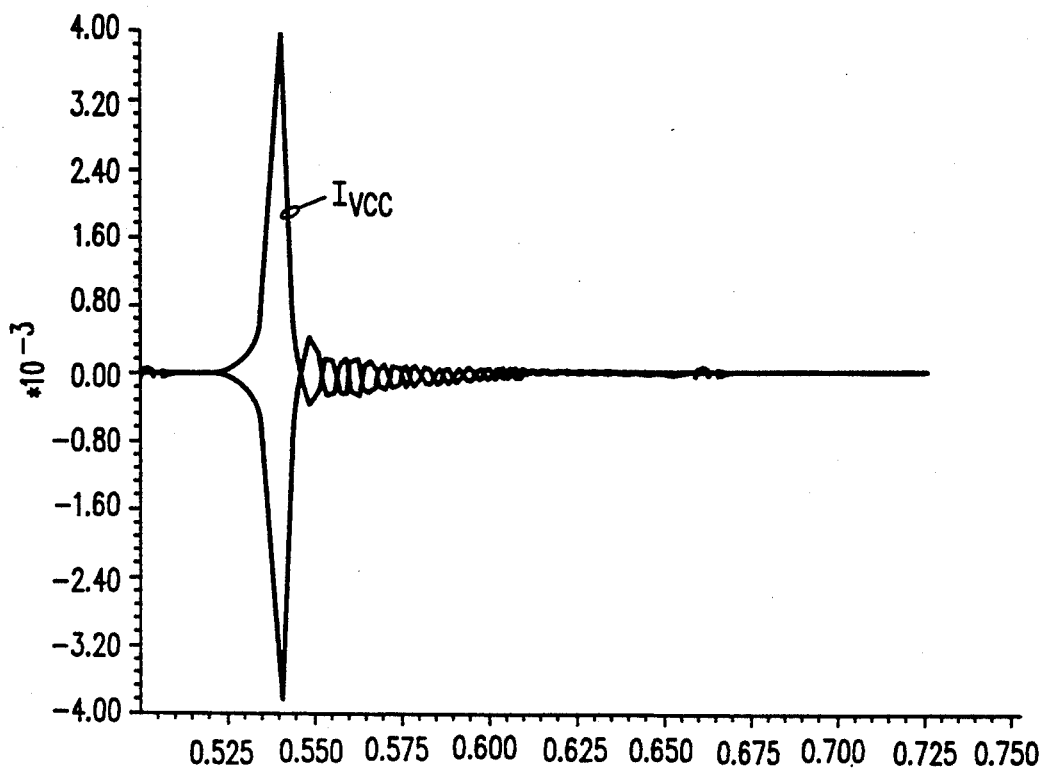
FIGS. 7A and 7B are illustrations of transient current waveforms for a prior art integrated circuit and an integrated circuit including the circuit means of the present invention, respectively.
Figure 7B:
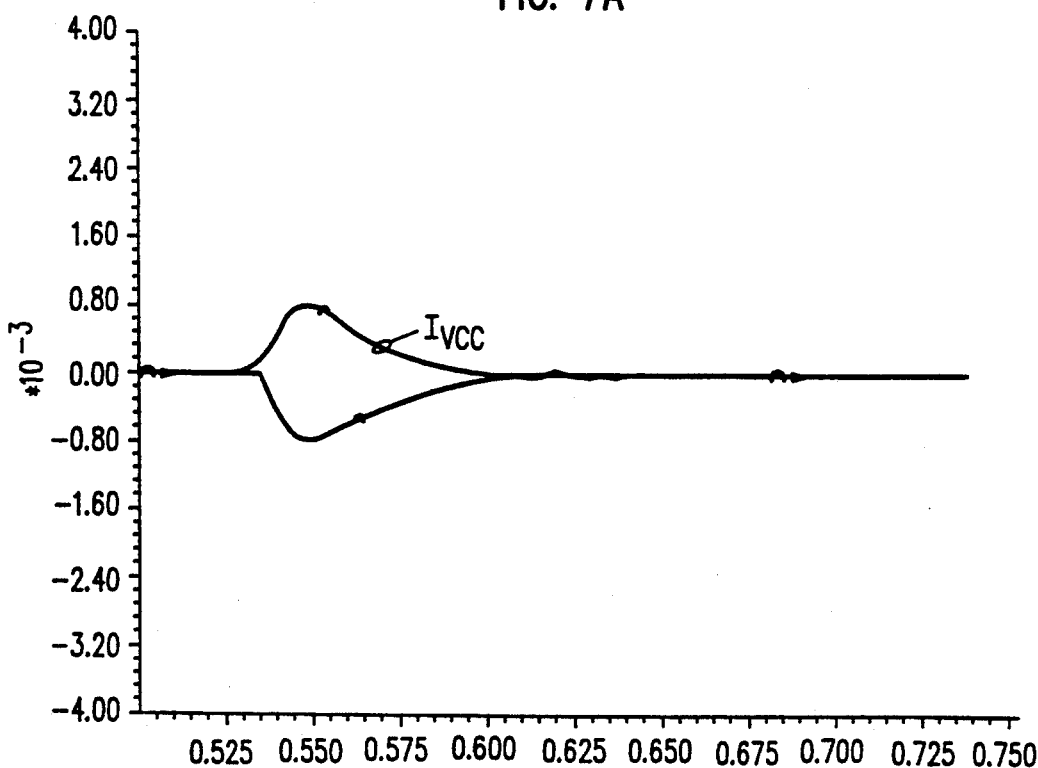

Referring now to FIG. 7A, a computer simulation of a typical transient current pulse waveform generated by the switching of logic elements of nucleus logic 24 in response to one transition of clock signal 58 is shown. It is this sudden, high amplitude pulse that is radiated by the power buss wiring associated with integrated circuit 12. However, as shown in FIG. 7B, the present invention significantly reduces the amplitude and increases the rise time of the transient current pulse while correspondingly reducing the radiated energy from integrated circuits. As noted above, switching resistor network 75 in series between the external power supply and the power supply buss of integrated circuit 12 provides a low pass filter comprising resistor network 75 and the intrinsic capacitance 25. This low pass filter buffers the power supply from the switching effect of the logic elements of nucleus logic 24. With the external supply buffered, capacitor 25, which is the lowest impedance current source, supplies the transient charge required by the switching logic. Since the gradual turn-off of buffer 92 modulates the resistance of the low pass filter, the power supply will supply additional current to complete the switching operation and recharge capacitor 25. In this manner, the amplitude of the transient current pulse is significantly reduced while the total charge required to be sourced by the power supply remains constant. Choke 26, in essence, distributes this charge requirement over an extended period of time. Further, the harmonics associated with the transient pulse are either eliminated or substantially reduced.

Figure 8:
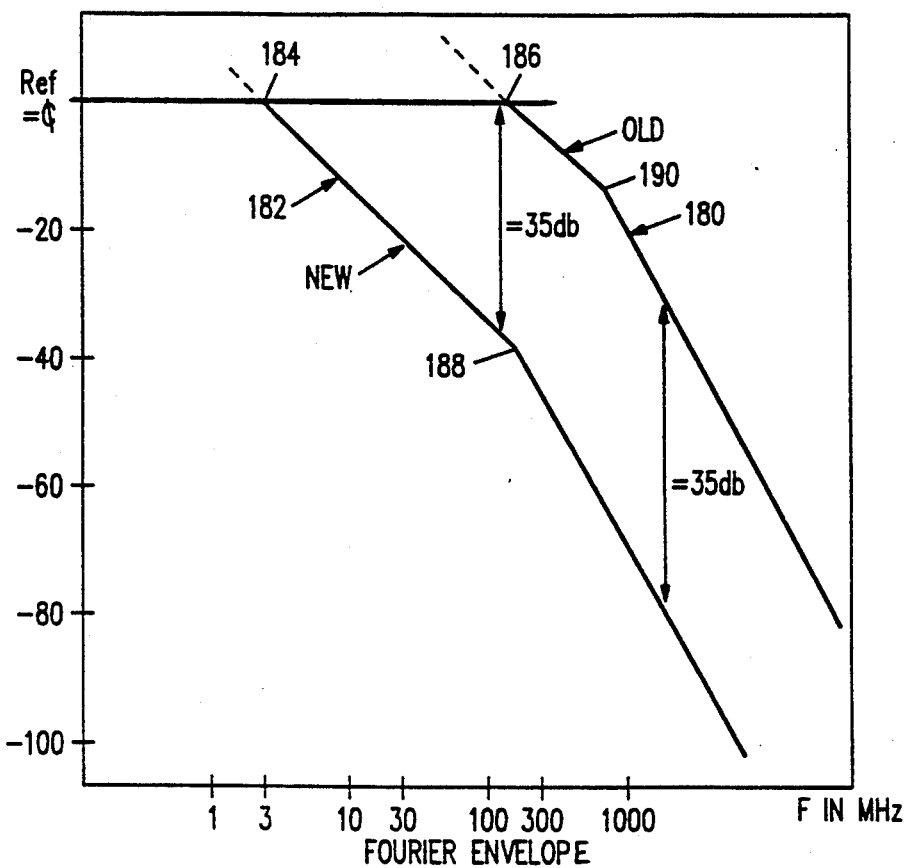
FIG. 8 illustrates a comparison of the Fourier envelope of a transient pulse waveform for an integrated circuit provided with circuit embodiments according to the present invention and an integrated circuit without the circuit embodiments.

By limiting the amplitude and the high frequency components of the transient current pulses that must be sourced by the external power supply, a significant reduction in electromagnetic emissions can be obtained. FIG. 8 graphically illustrates the reduction in electromagnetic emissions made possible from reducing the high frequency and harmonic components of the transient waveform. Curve 180 in FIG. 8 graphically illustrates the Fourier envelope of a transient current pulse generated in response to nucleus logic switching of a typical prior art integrated circuit (not shown). Curve 182 graphically illustrates the Fourier envelope of the same circuit incorporating one of the embodiments of the present invention.

FIG. 8 graphically illustrates the benefits of limiting the amplitude and the high frequency components associated with transient pulse waveforms. By way of comparison, curve 180 represents a transient waveform, generated by the nucleus logic switching of the prior art integrated circuit, having a rise time of 0.5 nanoseconds (ns) and a total pulse width of 2.0 ns. However, by incorporating one embodiment of the present invention onto integrated circuit 12, the rise time of the transient pulse waveform is lengthened to 1.5 ns and the pulse width is stretched to about 10.0 ns.

As a result of a slower rise time and greater pulse width, the corner frequencies of curve 182 advantageously occur at lower frequencies. As shown in FIG. 8, the first corner frequency 184 of curve 180 occurs at approximately 31 megahertz (MHz) compared to the first corner frequency of curve 180 which occurs at approximately 159 MHz.

The slope of the log magnitude frequency response curve 180 is zero below the corner frequency of 31 MHz and is $-20$ db/decade above the frist corner frequency. Thus, the embodiments of the present invention provide approximately a $-35$ db reduction in magnitude compared to prior art devices in the frequency range of 31 MHz to about 159 MHz.

A second corner frequency 188 of curve 182 is shown occurring at approximately 212 MHz with a slope of $-40$ db/decade. By shifting the corner frequency 188 relative to the prior art second corner frequency 190, significant reductions in the high frequency range is provided. For frequencies above second corner frequency 186, the attenuation provided by the present invention is still approximately $-35$ db better than in prior art circuits.

The first corner frequency 184 is a function of the duty cycle of the transient pulse waveform. Corner frequency 184 is shifted to a lower frequency relative to corner frequency 186 by decreasing the amplitude of the transient pulse waveform while the power required, that is, the current consumed, will remain constant. The second corner frequencies 188 and 190 are determined by the rise time of the transient pulse waveform. Thus, second corner frequency 188 is shifted into the lower frequency range by eliminating the high frequency components associated with rapid rise time of the prior art transient pulse waveform. It is significant, that the embodiments of the present invention eliminate the high frequency harmonics associated with transient pulse waveforms. Accordingly, the high frequency components, having been significantly attenuated, are no longer radiated or conducted to other components of the system and electromagnetic emission is significantly reduced.

Figure 9:
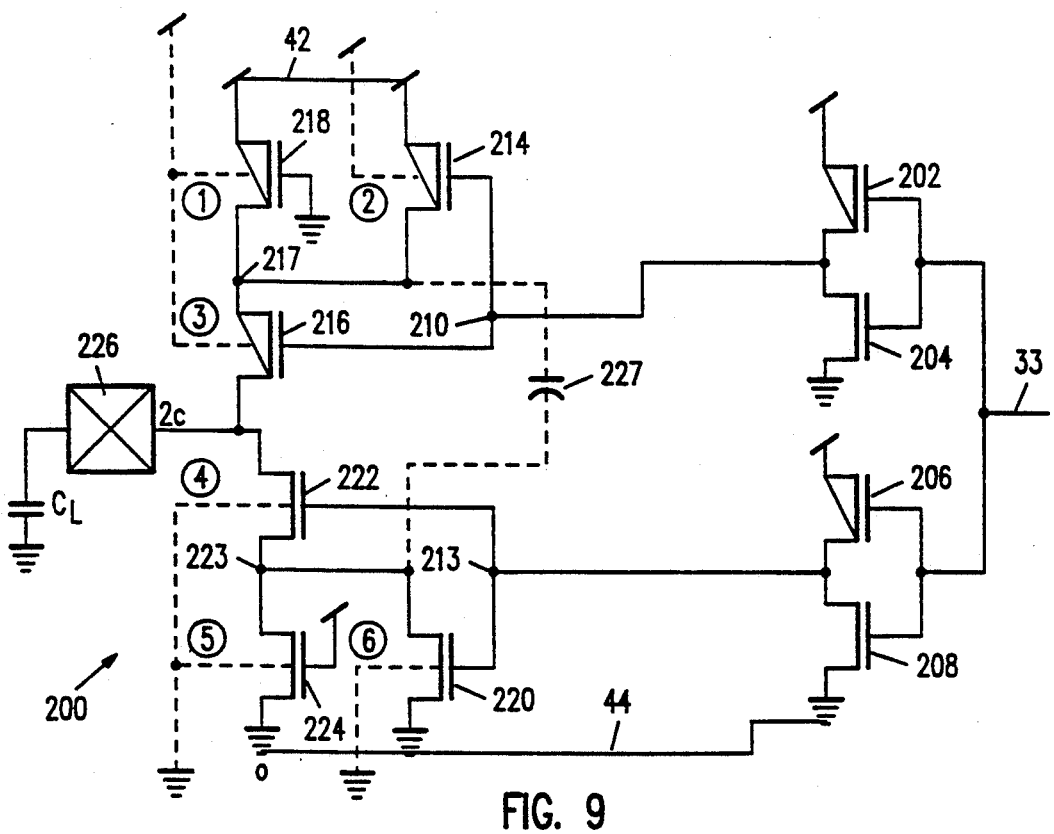
FIG. 9 is a schematic circuit diagram illustrating a preferred embodiment of an output buffer adapted for reducing electromagnetic emissions.

Electromagnetic emissions can be further reduced by providing a plurality of modified output buffers 32 on integrated circuit 12. Referring now to FIG. 9, data on signal line 33 simultaneously drives an upper buffer comprising transistors 202 and 204 and a lower buffer comprising transistors 206 and 208. Transistors 202 and 204 drive node 210 while transistors 206 and 208 drive node 212. The gates of transistors 214 and 216 are connected to node 210. Transistor 214 has a drain connected to buss 42 and a source connected to the drain of transistor 216. A transistor 218 is connected between buss 42 and the drain of transistor 216 and the gate of transistor 218 is biased such that it is always in the conducting state. Transistors 214-218 are preferably p-channel transistors.

The lower buffer drives a pair of transistors 220 and 222 which have their gates connected to node 212. Transistor 220 has its source coupled to buss 44 and its drain connected to the source of transistor 222. A transistor 224 is coupled between buss 44 and the source of transistor 222 and the gate of transistor 224 is biased such it is always in the conducting mode. The drain of transistor 222 is coupled to the source of transistor 216 and to an output pad 226. Preferably transistors 220-224 are n-channel transistors.

In operation, a HIGH logic level on signal line 33 generates a LOW logic level at nodes 210 and 212. Accordingly, transistors 214 and 216 are turned ON pulling output pad 226 to the HIGH state. At the substantially the same time, the low at node 212 biases transistors 222 and 220 in the OFF state.

In a similar manner, a low logic level on signal line 33 causes a HIGH logic level at nodes 210 and 212 biasing transistors 216 and 214 in the nonconducting state while transistors 220 and 222 are biased in the conducting state. In this manner, output pad 226 is driven to a LOW logic level. Because p-channel transistors and n-channel transistors switch from a high state to a low state (and vice-versa) at different rates, there is a period of time where a short can exist between busses 42 and 44.

To reduce the electromagnetic emissions generated by switching of output buffer 32, the relative size of transistors 202, 204, 206 and 208 are adjusted to minimize the transient current pulse generated by temporary shorts between busses 20 and 22. Such shorts are caused by the simultaneous conducting of transistor pairs 214, 216 and 218 and 220, 222 and 224. Accordingly, transistors 202-208 are preferably dimensioned such that transistors 214 and 216 are OFF before transistors 222 and 224 are switched into the ON state for a HIGH to LOW transition on signal line 33. For a LOW to HIGH transition, transistors 222 and 224 must be switched OFF prior to transistors 214 and 216 switching ON.

When initially biased in the ON state, transistor 216 or 222 are biased in full saturation conducting maximum current. However, transistors 214 and 220 are biased in the unsaturated region with an initial voltage from drain to source of substantially zero volts. This biasing is continuously accomplished between switching transients by transistors 218 and 224. Because of this, transistors 216 and 224 are current limited by the series presence of transistors 218, 214, 220 and 224. Full DC current drive capability is maintained by sizing transistors 214 and 216 and 220 and 222 large while 218 and 224 are dimensioned small. The initial source or sink transient current to or from the load capacitor $C_L$ is supplied by the parasitic diode capacitance associated with nodes 217 and 223 for transitions on pad 226. As the voltage on node 217 is reduced through the removal of stored charge, transistor 214 will increase the current it supplies. Transistor 220 operates in a similar but opposite manner to pull node 223 toward ground buss 44.

Figure 10A:
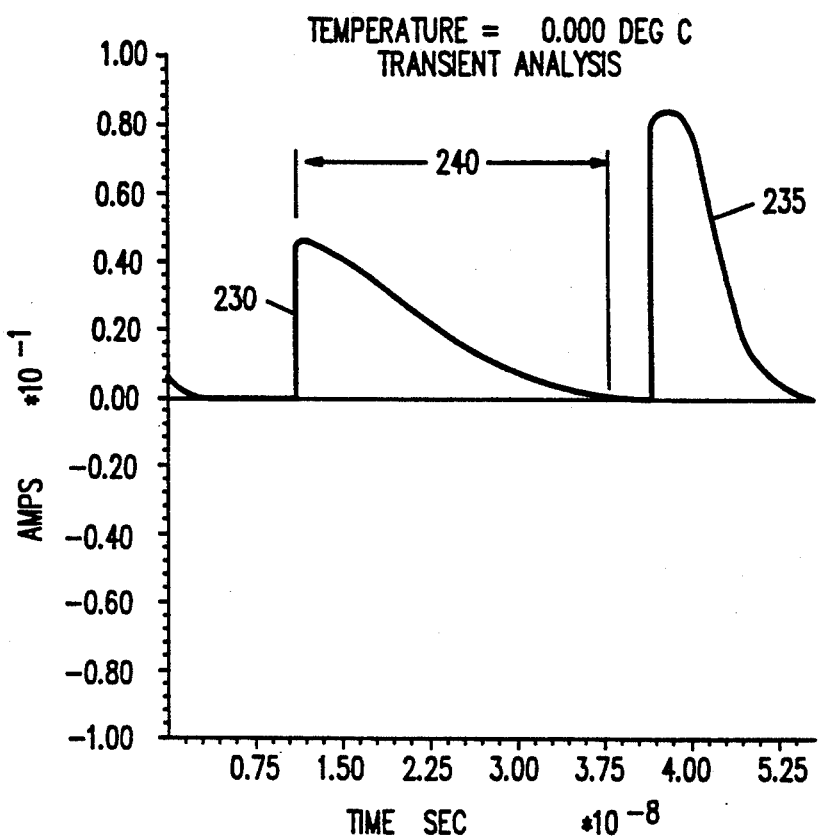
FIGS. 10A and 10B are illustrations of transient current waveforms generated by the output buffer of FIG. 9 and a typical prior art output buffer, respectively.
Figure 10B:
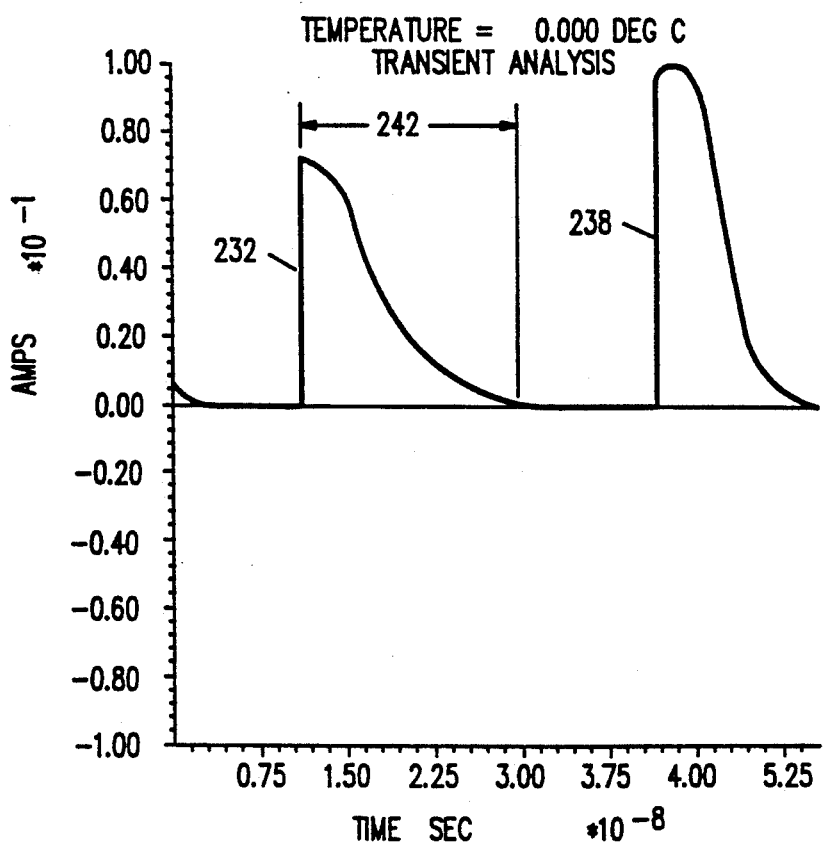

As shown in the simulations of FIG. 10A, the transient switching current waveform is reduced in amplitude and spread over a longer period of time relative to simulations of the transient switching current waveform in FIG. 10B which is representative of a typical prior art output buffer (not shown). FIGS. 10A and 10B are computer simulations showing a comparison of the slope of the current versus time graph for output buffer 32 and the prior art output buffer. With the improved circuit, a LOW to HIGH transition at output pad 226 produces a transient current waveform 230 (FIG. 10A) where load transistors 217 and 218 are sourcing current. Waveform 230 has a lower slope during the period from between about 1.00 seconds to about 2.25 seconds after switching of the output (portion 240 of waveform 230) in comparison to the slope of a typical prior art waveform 232 (FIG. 10B) for the same time interval (portion 242 of waveform 232). Further, according to one simulation, the maximum amplitude of waveform 230 is approximately 66% of the amplitude of waveform 232 thereby affording a reduction of approximately 34%.

For a transition at output pad 226, transient current waveform 235 (FIG. 10A) has a similarly reduced amplitude relative to the prior art waveform 238.

Output buffer 32 in essence switches an "active" resistor in series with power busses 42 and 44 to soften the transient power supply current spikes. Although the amplitude is lowered and electromagnetic emissions reduced, the area under the transient current waveforms in FIG. 10A remains substantially equal to the area under the transient current waveforms in FIG. 10B.

It should be apparent from the disclosed embodiments that the invention may be embodied in other specific forms without departing from its spirit or essential characteristics. For example, the pulse limiting circuit 56 can be implemented, either alone or in combination with other pulse limiting circuits positioned between buss 22 and nucleus logic 24. Pulse limiting circuits could also be adapted to soften transient current pulses on DVCC and DGND. Although the particular embodiments are described using CMOS logic, CMOS integrated circuits form only part of the broader category of integrated circuits to which this invention could be applied. The described embodiments are to be considered in all respects only as illustrated and not restrictive and the scope of the invention is, therefore, indicated by the appended claims.

What is claimed is:

1. In an integrated circuit having a power supply coupled to said integrated circuit by a power and a ground buss for supplying voltage and current to the nucleus logic elements of the integrated circuit, a circuit for reducing electromagnetic emission from said integrated circuit comprising:

a choke circuit having a first input connected to said power supply by said voltage buss, and an output corresponding to a voltage supply buss connected to said nucleus logic and a control input wherein a supply current for the integrated circuit flows from said first input to said output;

a clock delay circuit for receiving an input clock signal, said clock signals having rising and falling transitions;

means for generating a first and a second control signal and for providing said control signals to the control terminal of said choke circuit, said first control signal adapted to increase the resistance between the input and output of the choke circuit in response to a transition of said clock signal and said second control signal adapted to decrease the resistance between the input and output of said choke circuit a period of time after the transition of said clock signal;

said clock delay circuit adapted for providing a delayed clock signal to the nucleus logic where said delay clock has a transition occurring after the first control signal and before the second control signal.

2. The circuit of claim 1 wherein said choke circuit comprises a transistor having a first terminal coupled to said power supply by said voltage buss, a second terminal coupled to said nucleus logic by said voltage supply buss and a control terminal connected to the clock delay circuit; and a resistor network coupled in parallel with said first and second terminals of said transistor.

3. The circuit of claim 1 wherein said clock delay circuit comprises an input for receiving an input clock signal; a plurality of inverters for introducing a propagation delay for said clock signal, a two-input exclusive-NOR gate; and a gradual turn-off buffer having an input connected to the output of said Exclusive NOR gate and output connected to the control terminal of said choke circuit.

4. The circuit of claim 3 wherein said plurality of inverters provide a propagation delay substantially equal to the worst case propagation delay of the clock signal to the nucleus logic.

5. In an integrated circuit having a power supply (VCC) and a ground (GND) buss for supplying voltage and current to the nucleus logic elements of the integrated circuit, a circuit for reducing electromagnetic emissions comprising:
a first clock delay circuit for receiving a first clock signal at its input and for generating at its output a second clock signal delayed relative to said first clock signal;
a second clock delay circuit adapted for receiving said second clock signal at its input and for generating at its output a third clock signal delayed relative to said second clock;
means for comparing the phase difference between said first and third clocks and generating a control signal having a duration related to time difference between corresponding transition of said first clock signal and said third clock signal and a second control pulse having a duration determined by a second corresponding transitions of said first clock signal and said third clock signal;
a current clamp circuit means coupled between the power supply buss and the nucleus logic and adapted to connect a resistor in series between said nucleus logic elements and said supply busses for damping supply current transient.

6. The circuit of claim 5 wherein the duration of said second control pulse is longer than the duration of said first control pulse.

7. In an integrated circuit comprising:
an input for receiving a clock input signal and a clock delay buffer for generating a second clock signal delayed relative to said clock input signal;
a plurality of logic elements adapted to switch from one logic state to another logic state in response to said second clock signal;

a first power supply buss for receiving power from an external power supply and transmitting voltage and current to said logic elements;
a plurality of output buffers adapted to switch from one logic state to another logic state in response to data provided by said plurality of logic elements;
a level shifter for interfacing between said nucleus logic and said output buffers;
a second power buss for receiving power from an external power supply and transmitting voltage and current to said output buffers and said level shifter; and
a circuit for reducing electromagnetic emissions generated by said integrated circuit comprising:
a variable impedance circuit connected to series between said external power supply and said first power supply buss for providing a supply current to said first supply buss through said variable impedance circuit; said impedance circuit having a control input and adapted to provide a first and second impedance in response to a signal on said control input; and
circuit means for providing said control input signal to increase the impedance between said first power buss and said external power supply in response to a transition of said clock input signal for a duration of time sufficient to ensure the switching of said logic elements in response to a transition of said second clock signal so as to limit the amplitude and the high frequency components of a transient voltage or current pulse supplied by said power supply in response to the switching of said logic elements and to increase the duration of said voltage or current pulse; said circuit means further adapted to decrease the 5 impedance between said first power buss and said external power buss when said logic elements are substantially quiescent.

8. The circuit means of claim 7 wherein the amplitude is reduced by between 10 and 50 percent.

9. The circuit means of claim 7 wherein the amplitude is reduced by at least 34 percent.

10. The circuit means of claim 7 wherein the width of said pulse is increased by between 100 (2×) and 1000 (20×) percent.

11. The circuit means of claim 7 wherein the width of said pulse is increased by 500 (5×) percent.

12. A semiconductor integrated circuit device comprising:
a plurality of semiconductor structures composing a chip nucleus, said chip nucleus including a plurality of switching devices dissipating an initial transient switching current responsive to receipt of a first clock signal and having an associated parasitic capacitance; and
a choke device, coupled to said chip nucleus and responsive to a second clock signal that precedes said first clock signal, for inserting a variable impedance in series between a power supply and said chip nucleus prior to assertion of said first clock signal, said power supply providing supply current to said chip nucleus through said variable impedance, wherein said parasitic capacitance provides substantially all said initial transient switching current to said chip nucleus, said impedance gradually removed from in series between said power supply and said chip nucleus after provision of said initial transient switching current by said parasitic capacitance.

13. The semiconductor integrated circuit device of claim 12 wherein said choke device comprises:
- a first delay element for delaying said second clock signal to produce said first clock signal provided to said chip nucleus;
- a pulse limiting circuit, coupled to said power supply and to said chip nucleus, for receiving input current and supplying current to said chip nucleus, said pulse limiting circuit responsive to an assertion of a control signal to insert said impedance between said power supply and said chip nucleus to limit current flow and said pulse limiting circuit responsive to a deassertion of said control signal to gradually remove said impedance from in series;
- a second delay element, coupled to said first delay element, for delaying said first clock signal to produce a third clock signal; and
- a control circuit, coupled to said second delay element and to said pulse limiting circuit, for asserting said control signal responsive to said second clock signal and for deasserting said control signal responsive to said third clock signal.

14. A semiconductor integrated circuit device operated from an external power supply and using a clock signal, comprising:
- a plurality of semiconductor structures composing a chip nucleus, said chip nucleus including a first power input and a plurality of switching devices dissipating an initial transient switching current responsive to receipt of a first clock signal;
- a power supply pad for communicating a supply current from the external power supply to said power input of said chip nucleus; and
- a choke device having a second power input coupled to said power supply pad, a power output coupled to said first power input, and a variable impedance, wherein said supply current flows through said variable impedance from said second power input to said power output responsive to a second clock signal that precedes said first clock signal, and wherein said choke device impedes said supply currewnt prior to an assertion of said first clock signal.

15. The semiconductor integrated device of claim 14 further comprising a delay circuit coupled to said choke device for gradually removing an effective impedance between said power supply pad and said first power input after said assertion of said first clock signal.

16. The semiconductor integrated device of claim 14 wherein said chip nucleus further includes an associated parasitic capacitance, said associated parasitic capacitance providing substantially all said initial transient switching current to said chip nucleus.

17. The semiconductor integrated device of claim 15 wherein said choke device further comprises:
- a first delay element for delaying said second clock signal to produce said first clock signal provided to said chip nucleus;
- a second delay element, coupled to said first delay element, for delaying said first clock signal to produce a third clock signal;
- a control circuit, coupled to said second delay element for asserting a control signal responsive to said second clock signal and for deasserting said control signal responsive to said third clock signal; and
- a pulse limiting circuit, coupled to said power supply pad, to said first power input of said chip nucleus, and to said control circuit, said pulse limiting circuit operative to impede said supply current upon the assertion of said control signal and to gradually stop impeding said supply current upon the deassertion of said control signal.

18. A method for reducing electromagnetic emissions form a nucleus of an integrated circuit device operated from a power supply and responsive to a switch signal to initiate a switching state of the integrated circuit that dissipates an initial transient switching current, comprising the steps of:
- delaying an input signal to produce the switch signal to the nucleus;
- increasing an impedance, responsive to the input signal, in a conductive path for a current flow from a power supply to the nucleus, wherein said current flow provides the initial transient switching current for the nucleus; and thereafter
- reducing gradually said impedance.

19. In an electronic system including a power supply, a clock signal generator and a semiconductor integrated circuit, said semiconductor integrated circuit including a clock signal input terminal, nucleus logic elements, a plurality of output buffers and power busses for interconnecting said power supply to said nucleus logic elements and said output buffers comprising:
- means for selectively inserting a high impedance circuit device in series between said power supply and said nucleus logic for providing supply current to said nucleus logic through said high impedance prior to a transition of said clock signal to said nucleus logic; said means adapted to remove said high impedance circuit from in series between external power supply and said nucleus logic in a gradual manner;
- means for providing transient switching current to said nucleus logic; and
- output buffer circuit means for limiting transient current pulses from said external power supply and for providing initial source or sink transient current to or from a load capacitor during transitions between logic states of said output buffer.

20. The circuit of claim 19 wherein said initial transient current is provided by a parasitic diode capacitance associated with said output buffer.

21. A semiconductor integrated circuit device including a clock signal input terminal for receiving a clock signal, nucleus logic elements and terminals for connection to an external power supply comprising:
- means for selectively inserting a high impedance circuit device in series between said power supply and said nucleus logic for providing supply current to said nucleus logic through said high impedance prior to a transition of said clock signal to said nucleus logic; said means adapted to remove said high impedance circuit from in series between external power supply and said nucleus logic in a gradual manner;
- means for providing transient switching current to said nucleus logic; and
- output buffer circuit means for limiting transient current pulses from said external power supply and for providing initial source or sink transient current to or from a load capacitor during transitions between logic states of said output buffer.

22. The semiconductor integrated circuit of claim 21 wherein said inserting means comprises:
- a first delayed element for generating a nucleus logic clock delay relative to said clock signal at said clock input terminal;
- a second delayed element for generating a delay clock signal; said delayed clock signal delayed relative to said nucleus logic clock by a time period sufficient to insure substantial switching of said nucleus logic elements in response to a transition on said nucleus logic clock;
- a control circuit for generating a control pulse; said control pulse initiated by a transition on said externally generated clock signal and terminated by the delayed clock signal produced by said second delay element; and
- a pulse limiting circuit adapted to couple said external power supply to the power supply buss of said nucleus logic elements in one state and, in response to a transition to said nucleus logic clock, couple said external power supply to said nucleus logic elements through a high impedance element in another state.

23. The pulse limiting circuit of claim 22 wherein said high impedance resistive element comprises a resistor and wherein an impedance of said resistor is gradually reduced in response to the following edge of the pulse generated by said control circuit.

* * * * *